Figure 1:
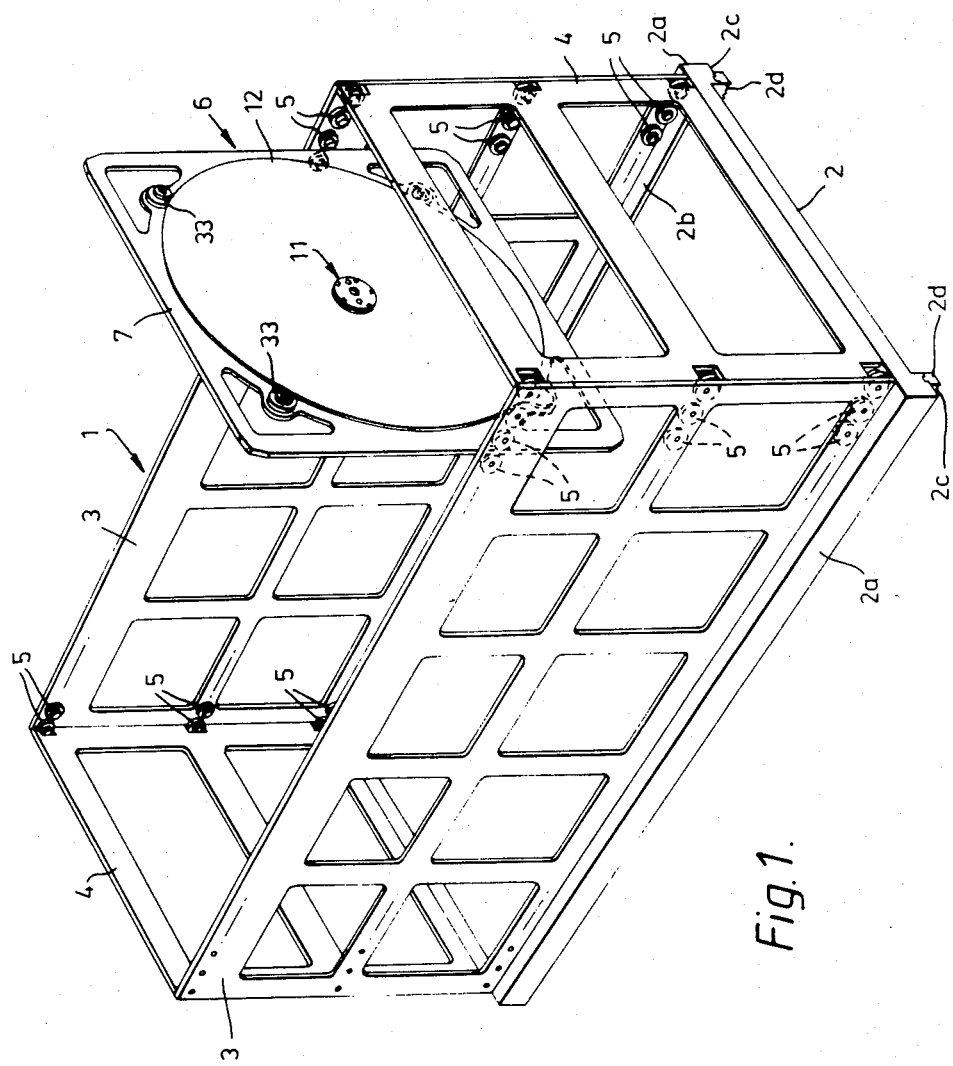

United States Patent [19]

Park et al.

[11] Patent Number: 4,511,194
[45] Date of Patent: Apr. 16, 1985

[54] MAGAZINE AND DISC HOLDERS FOR SUPPORTING DISCS IN THE MAGAZINE

[75] Inventors: George Park, Preston; Michael J. Smith, Darwen; Harry Carrington, Blackburn, all of England

[73] Assignee: U.S. Philips Corporation, New York, N.Y.

[21] Appl. No.: 472,809

[22] Filed: Mar. 7, 1983

[30] Foreign Application Priority Data

Mar. 26, 1982 [GB] United Kingdom ............... 8208910

[51] Int. Cl.$^3$ .................... G11B 1/02; A47B 81/06
[52] U.S. Cl. .................................. 312/12; 206/309; 211/40; 211/41; 312/187; 312/312
[58] Field of Search .................. 312/9, 50, 187, 183, 312/193, 286, 306, 10, 312, 12; 211/41, 151, 40, 184; 206/387, 309, 444; 369/290, 270, 271; 346/137

[56] References Cited

U.S. PATENT DOCUMENTS

| | | | |
|---|---|---|---|
| 929,723 | 8/1909 | Stearns | 211/151 X |
| 1,416,080 | 5/1922 | Vasselli | 369/271 |
| 1,926,606 | 9/1933 | Ward | 312/10 |
| 2,404,851 | 7/1946 | Knowles et al. | 312/286 |
| 2,797,925 | 7/1957 | Hawke | 312/286 X |
| 2,868,606 | 2/1959 | Stierna | 312/9 X |
| 3,349,924 | 10/1967 | Maurer et al. | 211/41 |
| 3,486,631 | 12/1969 | Rodman | 211/41 |
| 3,704,394 | 11/1972 | Johnson | |
| 3,798,423 | 3/1974 | Mindick | 211/41 X |
| 3,917,067 | 11/1975 | Brown et al. | 206/387 |
| 4,236,768 | 12/1980 | Morrone | 211/40 X |
| 4,375,850 | 3/1983 | Smyth et al. | 206/387 |

FOREIGN PATENT DOCUMENTS

| | | | |
|---|---|---|---|
| 517614 | 2/1953 | Belgium | 369/271 |
| 61120 | 4/1968 | Fed. Rep. of Germany | 369/271 |
| 2622598 | 7/1977 | Fed. Rep. of Germany . | |
| 2429270 | 1/1980 | France . | |
| 621794 | 4/1949 | United Kingdom | 312/183 |
| 1105801 | 3/1968 | United Kingdom . | |
| 1461464 | 1/1977 | United Kingdom . | |

Primary Examiner—William E. Lyddane
Assistant Examiner—Thomas A. Rendos
Attorney, Agent, or Firm—Robert T. Mayer; Algy Tamoshunas

[57] ABSTRACT

Centrally apertured discs which are to be subjected on one side to a treatment such as the deposition of a layer of material on the disc are carried on disc holders in a magazine which comprises a pair of opposed parallel walls and which has an open side between these walls through which the disc holders can be inserted in and removed from the magazine. The disc holders each comprise a rigid plate and attachment means for attaching a centrally apertured disc to each side of the plate, the attachment means engaging in the central aperture of each disc. The plate has at least one pair of opposed parallel edges for cooperation with guide rollers which are provided on the inner sides of the opposed walls of the magazine for guiding the disc holders during their insertion in and removal from the magazine in directions parallel to the opposed edges of the plates. The rollers also support the disc holders in the magazine with the plates of the holders lying in spaced parallel planes perpendicular to the opposed walls of the magazine. The magazine and disc holders are very suitable for use in the process in which a reflective layer of aluminium is deposited on a disc of a plastics material in the manufacture of video discs.

10 Claims, 5 Drawing Figures

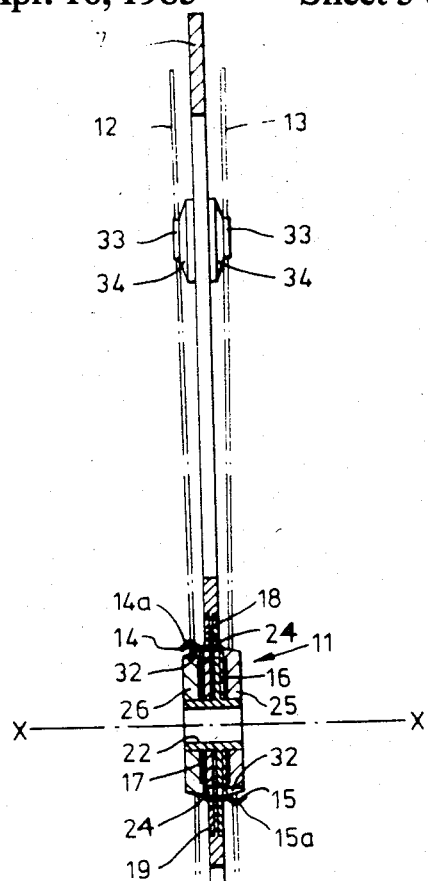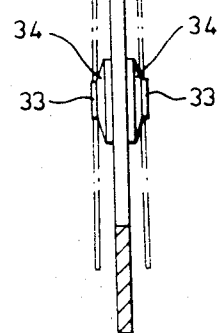
Fig.3.

MAGAZINE AND DISC HOLDERS FOR SUPPORTING DISCS IN THE MAGAZINE

The invention relates to a magazine and a plurality of disc holders for supporting a plurality of centrally apertured discs in the magazine. The invention relates particularly, though not exclusively, to a magazine and disc holders for use in processes in which centrally apertured discs are subjected on one side to a treatment such as, for example, the deposition of a layer of material on the disc. An example of this for which the invention is very suitable is the sputtering process whereby aluminium reflective layers are deposited on discs of a plastics material in the manufacture of video discs. This process takes place in a sputtering chamber, the plastics discs being fed into the chamber, coated with the aluminium layer and removed from the chamber, one at a time, or two at a time since each disc is coated on only one side. It is an object of the invention to provide a magazine and disc holders which will facilitate the transport of the discs through such a process.

G.B. P.S. 396,689 discloses a packing case or container for the transport of flat coils or rolls of electrical insulating tape or the like. The rolls are carried on flat, plate-like trays which are superimposed in horizontal positions one above the other in the container and are each formed on one side with a central upstanding boss which engages in a central aperture in the respective roll of tape to hold the roll against lateral movement on the tray. Such an arrangement would not be at all suitable for the type of duty for which the present invention is primarily intended. In the first place, the individual trays are held against movement in the container in the axial direction of the rolls of tape only by abutment with the rolls of tape on the adjacent trays, so that if a tray and the roll of tape thereon were removed from the container there would be nothing to prevent the remaining trays and rolls of tape from shifting in the container. Secondly, there is no provision for securing the rolls of tape to the trays in the axial direction. Consequently, when a tray is removed from the container, unless it is held in a position in which the central boss of the tray, if not directed vertically upwards, is at least inclined in an upward direction, there is a danger of the roll of tape sliding off the boss. This may not be a cause for concern in the transportation of rolls of tape, but to be subjected to such a limitation in a process of the kind referred to above would be a severe and most undesirable restriction.

According to the invention there is provided a magazine and a plurality of disc holders for supporting a plurality of centrally apertured discs in the magazine, the magazine comprising a pair of opposed walls which lie in parallel planes and having an open side between said walls through which the disc holders can be inserted in and removed from the magazine, and the disc holders each comprising a rigid plate with attachment means for attaching a centrally apertured disc to one side or each side of the plate, the plate having a pair of opposed parallel edges for cooperation with guide means which are provided on the inner sides of said walls of the magazine for guiding the disc holders during their insertion in and removal from the magazine in directions parallel to said edges of the plates of the holders and for supporting the disc holders in the magazine with the plates of the holders lying in spaced parallel planes, and the attachment means of each disc holder being arranged to engage in the central aperture or apertures of the respective disc or discs, and being constructed to engage over the edge or edges of the disc or discs surrounding the central aperture or apertures thereof so as to secure the disc or discs to the respective side or sides of the plate of the disc holder.

When used in the sputtering process described above, the magazine can be conveyed in a stepwise manner past the entrance to the sputtering chamber and in each interval between successive steps a disc holder with the plastics disc or discs attached thereto can be transferred from the magazine to the sputtering chamber, supported there while a layer of aluminium is deposited on each disc, and subsequently returned to the magazine.

By using a rigid plate for the main body of each disc holder, the overall dimension of the holder in the direction of the axis or axes of the disc or discs carried by the holder is reduced, and thus the number of disc holders that can be accommodated in a magazine of given size increased, compared with a fabricated component.

A preferred embodiment of the magazine and disc holders according to the invention is characterized in that said walls of the magazine are spaced apart by a distance substantially equal to the distance between said opposed edges of the plate of each disc holder so that the disc holders can be inserted in the magazine with the plates of the holders disposed in planes perpendicular to the planes of said walls of the magazine, and in that said guide means comprises a plurality of spaced parallel rows of equispaced guide rollers mounted on the inner side of each of said walls of the magazine, each row extending in a direction parallel to a plane containing said open side of the magazine, and the rollers being rotatable about axes perpendicular to the planes of said walls of the magazine.

The use of rollers for the guide means reduces the friction between the guide means and the plates of the disc holders compared with fixed slideways and also facilitates the entry of the plates into the guide means.

Optimum guidance and support for the disc holders is obtained in an embodiment of the invention which is characterised in that the guide rollers in the magazine are arranged so that the axis of each roller in each row of rollers lies in a plane which contains the axis of a roller in each of all the other rows of rollers in the magazine and which is perpendicular to the planes of said walls of the magazine and to the plane containing said open side of the magazine, the rollers also being arranged so that each roller on each of said walls of the magazine is substantially coaxial with a roller on the other of said walls, and the rollers in each row being spaced from one another by a distance such that the plate of a disc holder can be inserted at said opposed edges thereof between two adjacent rollers in each row of rollers on said walls of the magazine and will be in contact with these rollers on both sides of the plate at said opposed edges thereof.

The magazine may have a second open side opposite the first-mentioned open side, the two sides being situated in parallel planes, and a ledge may extend along the inner side of each of said walls of the magazine adjacent the boundary of said second open side of the magazine for engagement by the plates of the disc holders to support the holders in the magazine. This construction can be used to advantage with a lifting mechanism for lifting the disc holders out of, and if necessary subsequently lowering them back into, the magazine, as the lifting mechanism can conveniently engage the plates of the disc holders through the second open side of the magazine and lift the holders out of the magazine through the first-mentioned open side.

The invention also provides a disc holder for use in a combination of magazine and disc holders according to the invention, the disc holder comprising a rigid plate with attachment means for attaching a centrally apertured disc to each side of the plate, and the plate having a pair of opposed parallel edges for cooperation with the guide means provided on the inner sides of said walls of the magazine, characterised in that the attachment means comprise two groups of spring fingers arranged on an imaginary circle whose central axis is perpendicular to the plane of the plate of the disc holder, each group consisting of three or more fingers evenly distributed around said circle and each connected at one end to a support which carries that group of fingers and which is secured to the plate, the two supports of the two groups of fingers being disposed on opposite sides of the plate with the fingers on each support each extending through an aperture in the plate so that the proximal end of each finger is disposed on one side of the plate and the distal end on the other side, and each finger being formed with a protrusion at its distal end on the side of the finger remote from the central axis of said imaginary circle, the tips of the protrusions on each group of fingers lying on an imaginary circle having a diameter larger than that of the central apertures of the discs, and the fingers of each group being deflexible towards said central axis to permit the edge of one of said discs that surrounds the central aperture of the disc to pass over the protrusions on the respective fingers so that these protrusions, upon deflection of the fingers in the reverse direction, can engage over said edge of said disc to secure the disc to the respective side of the plate.

By supporting the two groups of spring fingers so that the proximal ends of the fingers are disposed on one side of the plate and their distal ends on the other side, for a given projection of the fingers from the plate the fingers can be given a greater length and therefore a greater resilience than if each finger of each group of fingers were disposed wholly on one side of the plate. This reduces the force required to press the centrally apertured discs onto and pull them off the attachment means. It also reduces the distance through which the attachment means project from each side of the plate and thus further reduces the overall dimension of the disc holder in the direction of the axes of the discs carried by the holder.

A preferred embodiment of the disc holder according to the invention is characterised in that the support of each group of spring fingers comprises a disc and the fingers of the respective group are formed integrally with this disc at the periphery thereof, each finger being connected at one end to said disc and extending therefrom in a direction parallel or substantially parallel to the centre axis of said disc. With this construction each group of spring fingers and their support can be formed simply and inexpensively from a blank made of, for example, stainless spring steel and consisting of a disc with fingers radiating from it, the fingers subsequently being bent over to extend axially from the disc to one side thereof to form the spring fingers.

The attachment means of each disc holder may be mounted in a circular aperture in the plate of the holder, the two groups of spring fingers of the attachment means extending through this aperture in opposite directions, and the supports of the two groups of spring fingers may be located coaxially with the aperture in the plate by two locating discs which fit in annular rebates formed one in each side of the plate at the edge of the plate surrounding the aperture therein, one of the locating discs being formed with a central sleeve which projects from both sides of this disc, and the other locating disc and said supports having central apertures which fit closely on said sleeve, and each of the locating discs being formed with a plurality of holes through which the two groups of spring fingers pass.

By mounting the attachment means in an aperture in the plate of the disc holder and locating the supports of the two groups of spring fingers of the attachment means coaxially with this aperture by means of locating discs which fit in annular rebates in the plate, a further reduction is obtained in the overall axial dimension of the disc holder.

The supports of the two groups of spring fingers and the locating discs of the attachment means of each disc holder may be clamped together in the axial direction by two annular clamping members, the central apertures of which fit closely on the central sleeve of said one of the locating discs, and one of which is formed with screwthreaded bores extending parallel to its axis to receive screws which pass through plain bores in the other clamping member and through holes in said support and the locating discs and through the aperture in the plate of the disc holder. This provides a simple and quick method of securing the two groups of spring fingers and the two locating discs to the plate.

A set of three or more studs may be mounted on each side of the plate of each disc holder, each stud having a conical or frusto-conical surface which tapers in a direction away from the plate and the studs of each set being evenly distributed about the central axis of the imaginary circle on which the two groups of spring fingers of the attachment means of the disc holder are arranged and being equally spaced from this axis by a distance such that when a centrally apertured disc is attached to either side of the plate the outer edge of the disc bears on the conical or frusto-conical surfaces of the studs on that side of the plate, and the construction of the studs being such that the outer edge of the centrally apertured disc, when bearing on the studs, is spaced further from the plate than the edge of the centrally apertured discs that surrounds the central aperture of the disc, when this edge is engaged behind the protrusions on the respective group of spring fingers.

As a result of the stress produced in the centrally apertured disc by this deflection of the disc, the disc is inhibited from performing any undesired movement on the disc holder. The studs further serve to hold the disc away from the plate of the disc holder. They also provide a convenient means of pre-positioning the disc when it is being attached to the disc holder.

The two sets of studs on the plate of each disc holder may be conveniently arranged in pairs each comprising a stud of each set and with the two studs of each pair disposed coaxially with one another on opposite sides of the plate and secured to the plate by a screw which passes through a plain bore in one of the studs and through a hole in the plate and screws into a screwthreaded bore in the other stud.

Figure 2:
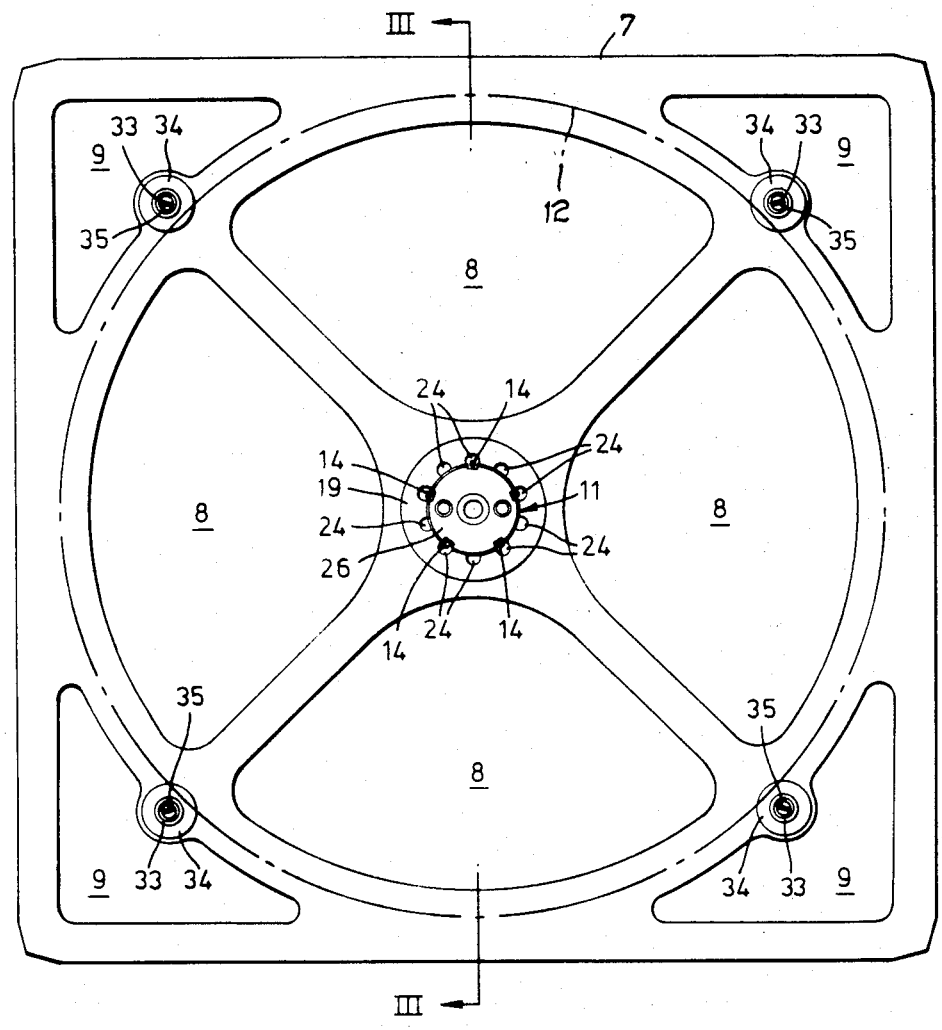
Figure 4:
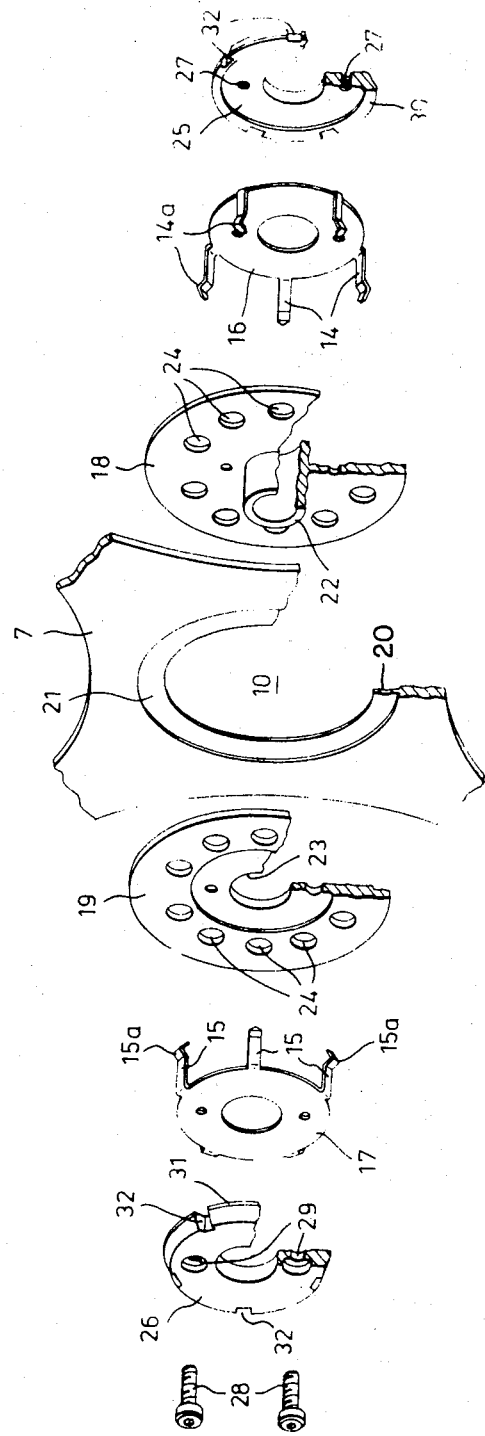
Figure 5:
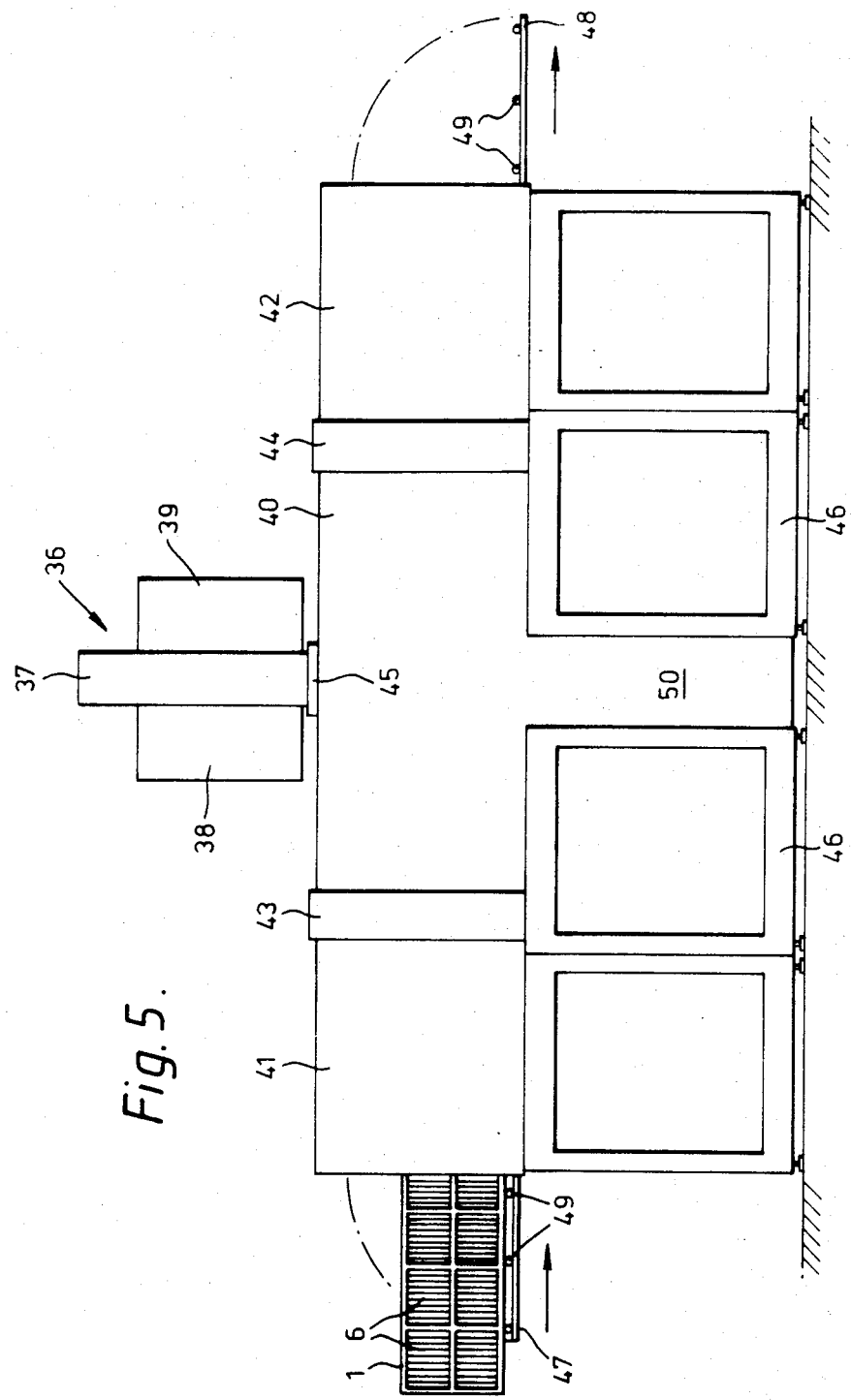

An embodiment of the magazine and disc holders according to the invention which is intended for, but not limited to, use in a sputtering process for forming the reflective aluminium layers of video discs will now be described with reference to the accompanying drawings, in which FIG. 1 is a perspective view of the magazine showing one of the disc holders, with two discs (only one can be seen) attached to it, being inserted in the magazine, FIG. 2 is an elevation of one of the disc holders drawn to a larger scale than FIG. 1, FIG. 3 is a sectional view taken on the line III—III in FIG. 2 but drawn to a slightly larger scale than FIG. 2, FIG. 4 is an exploded perspective view of the attachment means of the disc holder shown in FIGS. 2 and 3, and FIG. 5 is a diagrammatic side elevation of a sputtering plant constructed for use with magazines and disc holders according to the invention, a loaded magazine being shown about to enter the plant.

The magazine shown in FIG. 1, and designated 1, is of cuboidal form and comprises a rectangular bottom frame 2 made of stainless steel and two rectangular side walls 3 and end walls 4 which are fixed on the frame 2 and which are made of aluminium. The side and end walls are of skeletal construction to reduce their weight and the quantity of aluminium used in their manufacture. The magazine is open at its upper and lower sides.

On the inner side of each of the side walls 3 of the magazine are mounted three spaced parallel rows of guide rollers 5, including an upper row located adjacent the upper edge of the respective side wall, a lower row located at the bottom of the wall and an intermediate row situated midway between the upper and lower rows. Although only a few rollers are shown, each row extends the whole length of the respective side wall, parallel to the upper and lower edges of the wall. The rollers are rotatable about axes perpendicular to the planes of the side walls and in conjunction with the inner sides of these walls form guide means for guiding disc holders, of which one is shown in FIG. 1, designated 6, into and out of the magazine, as will be described later herein.

The disc holder 6, shown in detail in FIGS. 2 and 3, comprises a square plate 7 made of stainless steel and parts of which are removed, at 8 and 9, for example, to reduce the weight of the plate and the quantity of stainless steel used in its manufacture. In a circular aperture 10 (FIG. 4) in the centre of the plate 7 are mounted attachment means 11 whereby two discs 12 and 13, shown in dot-dash lines in FIG. 3, can be attached one to each side of the plate 7. The discs 12 and 13 are made of a plastics material and each form the main body of a video disc. Each disc has to be provided on one side with a reflective layer of aluminium. The discs each have a circular central aperture and the attachment means 11 are arranged to engage in the apertures of the two discs. The distance between the two edges of each pair of opposed edges of the plate 7 of the disc holder is larger than the diameter of the discs 12 and 13 so that the edges of the plate project beyond the peripheries of the discs for cooperation with the guide rollers 5 in the magazine 1, as will be described.

The attachment means 11 of the disc holder are shown in detail in FIGS. 2, 3 and 4 and comprise two groups of spring fingers 14 and 15 arranged on an imaginary circle of substantially the same diameter as the central apertures in the discs 12 and 13 and which is concentric with the central aperture 10 in the plate 7 of the disc holder, each group consisting of three or more, in the present case five, spring fingers evenly distributed around the imaginary circle and alternating on the circle with the fingers of the other group. Each group of spring fingers 14 and 15 is formed on the outer edge of a stainless spring-steel annular disc 16 and 17 respectively, the fingers on each disc being bent over to extend axially from the disc to one side thereof. The discs 16 and 17 are disposed on opposite sides of the plate 7 with the spring fingers on each disc extending through the central aperture 10 in the plate to the far side of the plate. Thus, each finger has its fixed, proximal end disposed on one side of the plate and its free, distal end disposed on the other side, as can be seen in FIG. 3. At its distal end each spring finger is bent to form a protrusion with sloping sides on the outer side of the finger, i.e., the side remote from the central axis X—X (FIG. 3) of the disc holder. This axis passes through the centre of the central aperture 10 in the plate 7. The protrusions on the fingers 14 and 15 are designated 14a and 15a respectively. The tips of the protrusions on each group of fingers lie on an imaginary circle having a diameter slightly larger than that of the central apertures of the discs 12 and 13. The spring fingers are accurately located relative to the axis X—X by two locating discs 18 and 19 which fit in annular rebates 20 and 21 formed one in each side of the plate 7 at the edge of the plate surrounding the central aperture 10 in the plate. The locating disc 18 is formed integrally with a central sleeve 22 which projects from both sides of the disc, and the other locating disc 19 has a central aperture 23 which is a close fit on the sleeve 22. The central apertures of the annular discs 16 and 17 on which the spring fingers 14 and 15 are formed also fit closely on the sleeve 22. Each of the locating discs 18 and 19 is formed concentrically with a circular series of ten equispaced holes 24 through which the ten spring fingers 14 and 15 pass, the fingers 14 alternating with the fingers 15. The supporting discs 16 and 17 of the spring fingers 14 and 15 and the locating discs 18 and 19 are all clamped tightly together in the axial direction by two annular members 25 and 26 of which one, in this case the clamping member 25, is formed with two screwthreaded bores 27 extending parallel to its axis to receive two screws 28 which pass through plain, i.e., non-threaded, bores 29 in the other clamping member. The screws also pass through holes in the annular discs 16 and 17 and the locating discs 18 and 19 and through the central aperture 10 in the plate 7. The central apertures of the annular clamping members 25 and 26 fit closely on the sleeve 22 of the locating disc 18. On their inner sides, i.e., the sides facing the plate 7, the clamping members 25 and 26 are formed with raised rims 30 and 31 respectively which bear against the proximal ends of the spring fingers 14 and 15 respectively, the supporting discs 16 and 17 of the spring fingers in turn bearing against the locating discs 18 and 19 respectively. Each of the clamping members is formed with five recesses 32 in it periphery, the recesses being equally spaced around the periphery of the respective clamping member and being so arranged that the spring fingers 14 or 15 whose distal ends are disposed on the same side of the plate 7 as that clamping member can deflect into the recesses.

The plastics discs 12 and 13 are attached to the disc holder 6 simply by pressing the central portion of each disc onto the attachment means 11 at one or the other side of the plate 7 of the disc holder. In this operation the inner edge of the respective disc 12 or 13, i.e., the edge surrounding the central aperture of the disc, engages the protrusions 14a or 15a on the spring fingers 14 or 15 whose distal ends project from the relevant side of the plate 7, and deflect these fingers inwardly until the inner edge of the disc 12 or 13 has passed over the protrusions 14a or 15a, whereupon the fingers spring back so that the protrusions engage over the inner edge of the disc and secure the disc to the side of the plate. The discs 12 and 13 can be equally simply pulled off the attachment means 11 to remove the discs from the disc holder.

By supporting the two groups of spring fingers 14 and 15 so that the proximal ends of the fingers of each group are disposed on one side of the plate 7 and their distal ends on the other side, for a given projection of the fingers from the plate the fingers can be given a greater length and therefore a greater resilience than if each finger of each group of finger were disposed wholly one one side of the plate. This reduces the force required to press the discs 12 and 13 onto and pull them off the attachment means 11. It also, for a given length of the spring fingers, results in a reduction in the distance through which the attachment means project from each side of the plate 7 and thus in the overall dimension of the disc holder measured in the direction of its central axis X—X. This dimension is further reduced by the use of a thin plate, namely the plate 7, for the main body of the disc holder. The reduced axial dimension of the disc holder results in a reduction in the amount of space occupied by the disc holder in the magazine.

To increase the firmness of the attachment of the discs 12 and 13 to the disc holder and inhibit undesired flexing of the discs on the holder, a set of three or more, in the present case four, studs 33 with conical or, as shown, frusto-conical surfaces 34 is provided on each side of the plate 7 of the disc holder. The studs of the two sets are arranged in pairs each comprising a stud of each set and with the two studs of each pair disposed coaxially with one another on opposite sides of the plate 7 and secured to the plate by a screw 35 which passes through a plain bore in one of the studs and through a hole in the plate 7 and screws into a screwthreaded bore in the other stud. The studs of each set are evenly distributed about the central axis X—X of the disc holder and are equally spaced from this axis by a distance such that the disc 12 or 13 attached to the respective side of the plate 7 bears at its outer edge on the frusto-conical surfaces 34 of the studs on that side of the plate. The construction of the studs is such that the outer edge of the disc, when bearing on the studs, is spaced further from the plate 7 than the inner edge of the disc, which is engaged behind the protrusions 14a or 15a on the respective spring fingers 14 or 15, so that the disc is stressed slightly due to its deflection and is thereby inhibited from performing any undesired movement on the disc holder. The studs 33 further serve to hold the discs 12 and 13 away from the plate 7. They also provide a convenient means of pre-positioning the discs when they are being attached to the disc holder.

The two side walls 3 of the magazine 1 are spaced apart by a distance substantially equal to the distance between the opposed edges of the plate 7 of the disc holder 6 so that the plate 7 can be inserted between the side walls in a plane perpendicular thereto and without significant play in this plane. The guide rollers 5 in the magazine are arranged so that the axis of each roller in each row of rollers lies in a plane which contains the axis of a roller in each of all the other five rows of rollers and which is perpendicular to the planes of the side walls 3 of the magazine and to the planes containing the open upper and lower sides of the magazine. The rollers are also arranged so that each roller on each side wall 3 is substantially coaxial with a roller on the other side wall. The rollers in each row are equally spaced from one another by a distance such that the plate 7 of a disc holder can be inserted at two opposed edges of the plate between two adjacent rollers in each row of rollers on the two side walls 3 and will be in contact with these rollers on both sides of the plate at the respective two opposed edges thereof. Thus, every two adjacent rollers in the upper row on each side wall 3 in combination with the two adjacent rollers directly below them in each of the intermediate and lower rows on that wall, and with the inner side of the wall, form a guide for an edge of the plate 7 of a disc holder during the insertion of the holder in and its removal from the magazine through the open upper side thereof. The disc holders inserted in the magazine remain supported in upright positions therein by the rollers 5, with the plates 7 of the disc holders lying in spaced parallel planes perpendicular to the planes of the side walls 3 of the magazine and to the planes containing the open upper and lower sides of the magazine. In these positions the plates 7 rest on ledges formed by the longitudinal side member 2a of the bottom frame 2 of the magazine. One of these ledges, designated 2b, can be seen in FIG. 1.

FIG. 5 shows a magazine similar to that shown in FIG. 1 and loaded with disc holders of the construction shown in FIGS. 2, 3 and 4, each carrying two plastics discs, about to enter a sputtering plant in which each of the plastics discs is to be coated on one side with a layer of aluminium. Since this plant forms no part of the present invention it is shown only diagrammatically and will not be described in detail. The plant comprises a sputtering chamber 36 having a central portion 37 for receiving a disc holder with the two respective discs attached to it, and two outer portions 38 and 39 housing two magnetrons (not shown) which perform the sputtering to deposit a layer of aluminum on each of the two discs simultaneously. Sputtering by magnetron is a known process and need not be described herein. The sputtering chamber 36 is mounted immediately above a magazine chamber 40 which adjoins an entry chamber 41 at one end and an exit chamber 42 at the other end, gate valves 43 and 44 being interposed between the magazine chamber and the entry and exit chambers respectively. The sputtering is carried out in a vacuum in the chamber 36 and a flap valve is arranged in a housing 45 between the sputtering chamber 36 and the magazine chamber 40 to seal the opening through which the disc holders pass between these two chambers. The chambers 40, 41 and 42 are supported above the ground on a supporting structure 46. Hinged vacuum-tight doors 47 and 48 are provided at the entrance to the entry chamber 41 and the exit from the exit chamber 42 respectively. The magazine is conveyed on rollers 49 provided on the inner sides of the doors 47 and 48 and on the floors of the entry chamber 41, the magazine chamber 40 and the exit chamber 42. The rollers are arranged at the sides of the chambers in two parallel lines for cooperation with flat surfaces 2c (FIG. 1) extending along the undersides of the two longitudinal side members 2a of the bottom frame 2 of the magazine 1. The magazine is moved into the entry chamber 41 and out of the exit chamber 42 by chains (not shown) which cooperate with pawls (not shown) on the bottom of the magazine. In the magazine chamber 40 the magazine is advanced in a stepwise manner by pinions (not shown) which cooperate with toothed racks 2d extending along the undersides of the side members 2a of the bottom frame 2 of the magazine, next to the flat surfaces 2c.

When the magazine 1 has entered the entry chamber 41 the vacuum-tight door 47 is closed. The gate valve 43 is then opened to allow the magazine to be moved forward by the aforesaid chains into the magazine chamber 40, which has already been pumped down to the level of vacuum obtaining in the sputtering chamber 36. The gate valve 43 is then closed again and any loss of vacuum in the magazine chamber made good. In the magazine chamber 40, which has a length slightly greater than twice the length of the magazine 1, the magazine is indexed forward in steps which are each equal to the distance between the centres of adjacent rollers in each row of guide rollers 5 in the magazine. In each interval between successive steps, a disc holder is lifted from the magazine into the sputtering chamber 36, supported there while a layer of aluminium is deposited on each of the plastics discs attached to the disc holder, and subsequently lowered back into the magazine again. The lifting and lowering is carried out by a hydraulically operated mechanism (not shown) which is accommodated in a well 50 in the bottom of the magazine chamber 40 and which engages the plates 7 of the disc holders one at a time through the open bottom of the magazine 1. At the end of its downward stroke this mechanism actuates the pinion which cooperates with the toothed racks 2d on the bottom of the magazine and which indexes the magazine forward. When all the plastics discs on the disc holders in the magazine 1 have been coated with an aluminium layer, the gate valve 44 is opened, the vacuum-tight door 48 being shut, and the magazine is moved forward by the chains from the magazine chamber 40 into the exit chamber 42. The gate valve 44 is then closed again and the door 48 is opened to allow the magazine to leave the exit chamber 42.

By attaching the discs to the disc holders at only the inner edges of the discs, the entire area of one side of each disc is left free to receive an aluminum coating.

The small axial dimension of the disc holders is of particular advantage in the above sputtering plant, since it increases the number of disc holders and therefore the number of discs that can be accommodated in a magazine of given length, and since the length of the magazine chamber of the sputtering plant is related to the length of the magazine, it also increases the number of discs that can be accommodated in a magazine chamber of given length.

The invention is not limited to the above embodiment. For example, a disc holder could be constructed which would carry a plurality of discs on each side. Such a disc holder could be used in the manufacture of audio discs of a kind which is similar to but considerably smaller than a video disc and which, like a video disc, consists of a disc of plastics material coated on one side with a layer of aluminium. Information is recorded on and played back from these audio discs by opto-electronic means similar to those used for recording information on and playing it back from video discs. A disc holder constructed to carry, say, four plastic discs on each side would comprise a rigid plate formed with four circular apertures instead of one central aperture as in the plate 7 described above. The four apertures would be symmetrically arranged in the plate; in a square plate they would be arranged at the four corners of an imaginary square having its centre at the centre of the plate. Attachment means similar to the attachment means 11 described above would be mounted in each of the four apertures, and arranged around each aperture on each side of the plate would be a set of studs similar to the studs 33 described above.

What is claimed is:

1. A magazine and a plurality of disc holders for supporting a plurality of centrally apertured discs in the magazine, the magazine comprising a pair of opposed walls which lie in parallel planes and having an open side between said walls through which the disc holders can be inserted in and removed from the magazine, and the disc holders each comprising a rigid plate with attachment means for attaching a centrally apertured disc to one or each side of the plate, the plate having a pair of opposed parallel edges for cooperation with guide means which are provided on the inner sides of said walls of the magazine for guiding the disc holders during their insertion in and removal from the magazine in directions parallel to said edges of the plates of the holders and for supporting the disc holders in the magazine with the plates of the holders lying in spaced parallel planes, and the attachment means of each disc holder being arranged to engage in the central aperture or apertures of the respective disc or discs and being constructed to engage over the edge or edges of the disc or discs surrounding the central aperture or apertures thereof so as to secure the disc or discs to the respective side or sides of the plate of the disc holder.

2. A magazine and a plurality of disc holders as claimed in claim 1, characterized in that said walls of the magazine are spaced apart by a distance substantially equal to the distance between said opposed edges of the plate of each disc holder so that the disc holders can be inserted in the magazine with the plates of the holders disposed in planes perpendicular to the planes of said walls of the magazine, and in that said guide means comprise a plurality of spaced parallel rows of equispaced guide rollers mounted on the inner side of each of said walls of the magazine, each row extending in a direction parallel to a plane containing said open side of the magazine, and the rollers being rotatable about axes perpendicular to the planes of said walls of the magazine.

3. A magazine and a plurality of disc holders as claimed in claim 2, characterized in that the guide rollers in the magazine are arranged so that the axis of each roller in each row of rollers lies in a plane which contains the axis of a roller in each of all the other rows of rollers in the magazine and which is perpendicular to the planes of said walls of the magazine and to the plane containing said open side of the magazine, the rollers also being arranged so that each roller on each of said walls of the magazine is substantially coaxial with a roller on the other of said walls, and the rollers in each row being spaced from one another by a distance such that the plate of a disc holder can be inserted at said opposed edges thereof between two adjacent rollers in each row of rollers on said walls of the magazine and will be in contact with these rollers on both sides of the plate at said opposed edges thereof.

4. A magazine and a plurality of disc holders as claimed in claim 1, 2 or 3, characterized in that the magazine has a second open side opposite the first-mentioned open side, the two sides being situated in parallel lines, and in that a ledge extends along the inner side of each of said walls of the magazine adjacent the boundary of said second open side of the magazine for engagement by the plates of the disc holders to support the holders in the magazine.

5. A magazine and a plurality of disc holders for supporting a plurality of centrally apertured discs in the magazine, the magazine comprising a pair of opposed walls which lie in parallel lines and having an open side between said walls through which the disc holders can be inserted in and removed from the magazine, and the disc holders each comprising a rigid plate with attachment means for attaching a centrally apertured disc to each side of the plate, the plate having a pair of opposed parallel edges for cooperation with guide means which are provided on the inner sides of said walls of the magazine for guiding the disc holders during their insertion in and removal from the magazine in directions parallel to said edges of the plates of the holders and for supporting the disc holders in the magazine with the plates of the holders lying in spaced parallel planes, and the attachment means of each disc holder being arranged to engage over the edge of the disc surrounding the central apertures thereof and comprising two groups of spring fingers arranged on an imaginary circle whose central axis is perpendicular to the plane of the plate of the disc holder, each group consisting of three or more fingers evenly distributed around said circle and each connected at one end to a support which carries that group of fingers and which is secured to the plate, the two supports of the two groups of fingers being disposed on opposite sides of the plate with the fingers on each support each extending through an aperture in the plate so that the proximal end of each finger is disposed on one side of the plate and the distal end on the other side, and each finger being formed with a protrusion at its distal end on the side of the finger remote from the central axis of said imaginary circle, the tips of the protrusions on each group of fingers lying on an imaginary circle having a diameter larger than that of the central apertures of the discs, and the fingers of each group being deflectable towards said central axis to permit the edge of one of said discs that surrounds the central aperture of the disc to pass over the protrusions on the respective fingers so that these protrusions, upon deflection of the fingers in the reverse direction, can engage over said edge of said disc to secure the disc to the respective side of the plate.

6. A disc holder as claimed in claim 5, characterized in that the support of each group of spring fingers comprises a disc and the fingers of the respective group are formed integrally with this disc at the periphery thereof, each finger being connected at one end to said disc and extending therefrom in a direction substantially parallel to the central axis of said disc.

7. A disc holder as claimed in claim 6, characterised in that the attachment means of each disc holder are mounted in a circular aperture in the plate of the holder, the two groups of spring fingers of the attachment means extending through this aperture in opposite directions, and in that the supports of the two groups of spring fingers are located axially with the aperture in the plate by two locating discs which fit in annular rebates formed one in each side of the plate at the edge of the plate surrounding the aperture therein, one of the locating discs being formed with a central sleeve which projects from both sides of this disc, and the other locating disc and said supports having central apertures which fit closely on said sleeve, and each of the locating discs being formed with a plurality of holes through which the two groups of spring fingers pass.

8. A disc holder as claimed in claim 7, characterised in that the supports of the two groups of spring fingers and the locating discs of the attachment means of each disc holder are clamped together in the axial direction by two annular clamping members, the central apertures of which fit closely on the central sleeve of said one of the locating discs, and one of which is formed with screwthreaded bores extending parallel to its axis to receive screws which pass through plain bores in the other clamping member and through holes in said supports and the locating discs and through the aperture in the plate of the disc holder.

9. A disc holder as claimed in claim 5, 6, 7 or 8, characterised in that a set of three or more studs is mounted on each side of the plate of each disc holder, each stud having a conical or frusto-conical surface which tapers in a direction away from the plate and the studs of each set being evenly distributed about the central axis of the imaginary circle on which the two groups of spring fingers of the attachment means of the disc holder are arranged and being equally spaced from this axis by a distance such that when a centrally apertured disc is attached to either side of the plate the outer edge of the disc bears on the conical or frusto-conical surfaces of the studs on that side of the plate, and the construction of the studs being such that the outer edge of the centrally apertured disc, when bearing on the studs, is spaced further from the plate than the edge of the centrally apertured disc that surrounds the central aperture of the disc, when this edge is engaged behind the protrusions on the respective group of spring fingers.

10. A disc holder as claimed in claim 9, characterised in that the two sets of studs on the plate of each disc holder are arranged in pairs each comprising a stud of each set and with the two studs of each pair disposed coaxially with one another on opposite sides of the plate and secured to the plate by a screw which passes through a plain bore in one of the studs and through a hole in the plate and screws into a screwthreaded bore in the other stud.

* * * * *

UNITED STATES PATENT AND TRADEMARK OFFICE
CERTIFICATE OF CORRECTION

PATENT NO. :   4,511,194

DATED      :   April 16, 1985

INVENTOR(S) :  George Park et al

It is certified that error appears in the above-identified patent and that said Letters Patent is hereby corrected as shown below:

<u>IN THE CLAIMS</u>

Claim 5, line 4    change "lines" to --planes--

Signed and Sealed this

Twenty-ninth Day of November, 1988

Attest:

DONALD J. QUIGG

*Attesting Officer*    *Commissioner of Patents and Trademarks*